(12) United States Patent
Cheng et al.

(10) Patent No.: US 11,430,879 B2
(45) Date of Patent: Aug. 30, 2022

(54) METHOD AND STRUCTURE FOR FORMING DIELECTRIC ISOLATED FINFET WITH IMPROVED SOURCE/DRAIN EPITAXY

(71) Applicant: Tessera, Inc., San Jose, CA (US)

(72) Inventors: Kangguo Cheng, Schenectady, NY (US); Juntao Li, Cohoes, NY (US)

(73) Assignee: Tessera, Inc., San Jose, CA (US)

( * ) Notice: Subject to any disclaimer, the term of this patent is extended or adjusted under 35 U.S.C. 154(b) by 25 days.

(21) Appl. No.: 17/102,098

(22) Filed: Nov. 23, 2020

(65) Prior Publication Data
US 2021/0104620 A1 Apr. 8, 2021

Related U.S. Application Data

(63) Continuation of application No. 16/014,676, filed on Jun. 21, 2018, now Pat. No. 10,847,639, which is a
(Continued)

(51) Int. Cl.
| | |
|---|---|
| *H01L 29/66* | (2006.01) |
| *H01L 27/12* | (2006.01) |
| *H01L 21/84* | (2006.01) |
| *H01L 21/762* | (2006.01) |
| *H01L 29/417* | (2006.01) |
| *H01L 29/78* | (2006.01) |
| *H01L 21/8234* | (2006.01) |
| *H01L 27/088* | (2006.01) |
| *H01L 21/02* | (2006.01) |

(Continued)

(52) U.S. Cl.
CPC .. *H01L 29/66818* (2013.01); *H01L 21/02236* (2013.01); *H01L 21/02645* (2013.01); *H01L 21/3003* (2013.01); *H01L 21/3065* (2013.01); *H01L 21/76202* (2013.01); *H01L 21/76264* (2013.01); *H01L 21/76283* (2013.01); *H01L 21/823431* (2013.01); *H01L 21/845* (2013.01); *H01L 27/0886* (2013.01); *H01L 27/1211* (2013.01); *H01L 29/045* (2013.01); *H01L 29/0649* (2013.01); *H01L 29/0847* (2013.01); *H01L 29/41791* (2013.01); *H01L 29/495* (2013.01); *H01L 29/4966* (2013.01); *H01L 29/66545* (2013.01); *H01L 29/66636* (2013.01); *H01L 29/66795* (2013.01); *H01L 29/785* (2013.01); *H01L 29/7848* (2013.01)

(58) Field of Classification Search
None
See application file for complete search history.

(56) References Cited

U.S. PATENT DOCUMENTS

| | | |
|---|---|---|
| 8,729,634 B2 | 5/2014 | Shen et al. |
| 8,835,268 B2 | 9/2014 | Sudo |
| (Continued) | | |

OTHER PUBLICATIONS

List of IBM Patents or Patent Applications Treated as Related dated Jun. 21, 2018, 2 pages.

*Primary Examiner* — Long Pham
(74) *Attorney, Agent, or Firm* — Lee & Hayes, P.C.

(57) ABSTRACT

Described herein is a FinFET device in which epitaxial layers of semiconductor material are formed in source/drain regions on fin portions. The fin portions can be located within a dielectric layer that is deposited on a semiconductor substrate. Surfaces of the fin portions can be oriented in the {100} lattice plane of the crystalline material of the fin portions, providing for good epitaxial growth. Further described are methods for forming the FinFET device.

21 Claims, 6 Drawing Sheets

Related U.S. Application Data continuation of application No. 15/464,817, filed on Mar. 21, 2017, now Pat. No. 10,056,255, which is a continuation of application No. 15/006,284, filed on Jan. 26, 2016, now Pat. No. 9,601,514.

(51) Int. Cl.
*H01L 21/30* (2006.01)
*H01L 29/08* (2006.01)
*H01L 21/3065* (2006.01)
*H01L 29/04* (2006.01)
*H01L 29/06* (2006.01)
*H01L 29/49* (2006.01)

(56) References Cited

U.S. PATENT DOCUMENTS

| | | |
|---|---|---|
| 8,956,942 B2 | 2/2015 | Loubet et al. |
| 8,957,477 B2 | 2/2015 | Chang et al. |
| 9,041,094 B2 | 5/2015 | He et al. |
| 9,443,769 B2 | 9/2016 | Wang et al. |
| 2013/0065326 A1 | 3/2013 | Sudo |
| 2013/0320455 A1 | 12/2013 | Cappellani et al. |
| 2015/0187943 A1 | 7/2015 | Lee et al. |
| 2015/0221726 A1 | 8/2015 | Wong et al. |
| 2015/0236016 A1 | 8/2015 | Wann et al. |
| 2015/0255608 A1 | 9/2015 | Cai et al. |
| 2015/0303118 A1 | 10/2015 | Wang et al. |
| 2017/0025535 A1 | 1/2017 | Wu et al. |
| 2017/0076992 A1 | 3/2017 | He et al. |
| 2017/0207095 A1 | 7/2017 | Lee et al. |

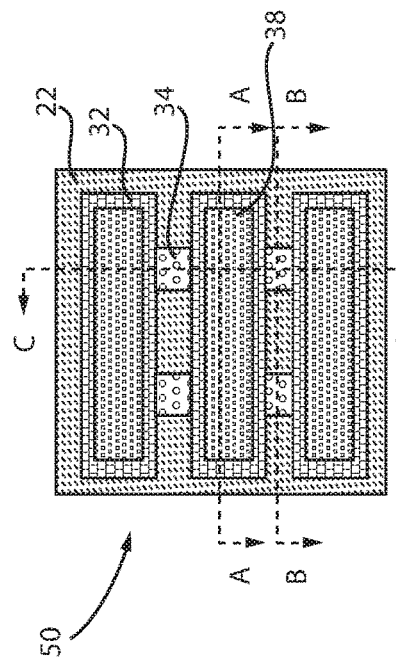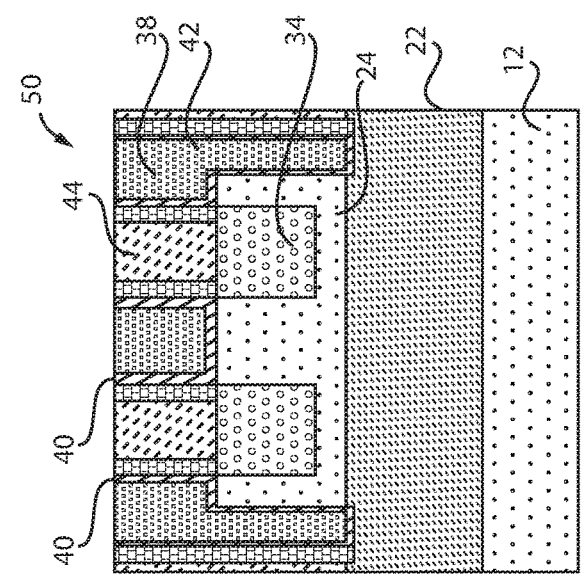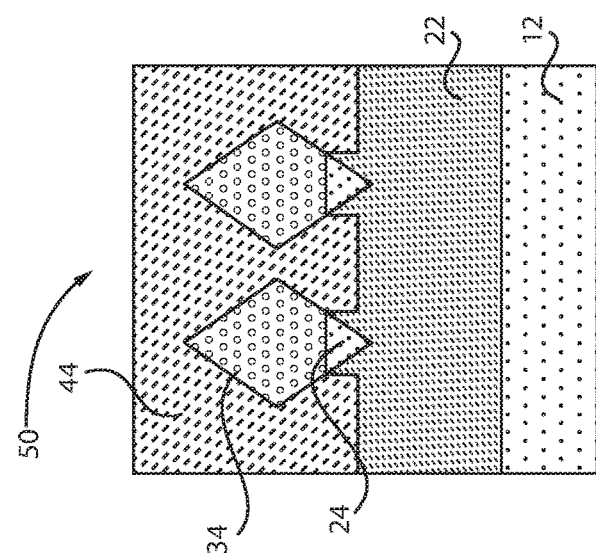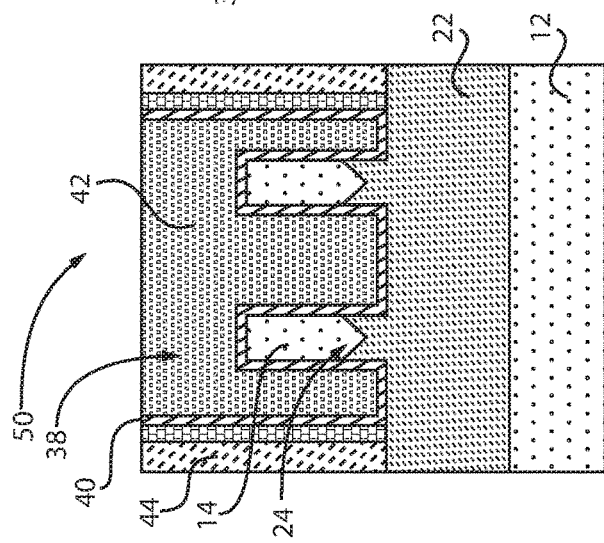

METHOD AND STRUCTURE FOR FORMING DIELECTRIC ISOLATED FINFET WITH IMPROVED SOURCE/DRAIN EPITAXY

CROSS REFERENCE TO RELATED APPLICATIONS

This disclosure is a continuation of and claims priority to U.S. patent application Ser. No. 16/014,676, filed Jun. 21, 2018, which is a continuation of U.S. patent application Ser. No. 15/464,817, filed Mar. 21, 2017, now U.S. Pat. No. 10,056,255, issued Aug. 21, 2018, which is a continuation of U.S. patent application Ser. No. 15/006,284, filed Jan. 26, 2016, now U.S. Pat. No. 9,601,514, issued Mar. 21, 2017, which are incorporated herein by reference as if fully set forth below.

BACKGROUND

Technical Field

The present invention relates to field effect transistors, and more particularly to fin-including field effect transistor (FinFET) devices with dielectrically isolated crystalline fin surfaces for promoting epitaxial growth in source/drain regions.

Description of the Related Art

Dielectric layers employed in silicon-on-insulator (SOI) FinFET devices isolate circuitry in a way that is superior to the isolation provided by the bulk FinFET devices. The punch-through stop doping employed in the bulk FinFET configuration is not as effective in this regard when compared to the isolation provided by a dielectric layer, e.g., an oxide layer.

To improve source-drain to channel junction sharpness in a FinFET configuration, the fins in a source/drain region are recessed before epitaxially growing the in-situ doped source/drain epitaxial layer. This contrasts with bulk FinFET configurations where recessing the source/drain does not cause an epitaxial layer growth issue. In the bulk FinFET configuration, the remaining fin provides an effective seed layer for growing a good epitaxial coating on the {100} lattice plane. For SOI FinFET, however, once the fins in the source/drain regions are recessed in the oxide layers, there is no seed layer on which to grow an epitaxial layer. Source/drain epitaxy growth could occur on the fin sidewalls, but these surfaces are oriented in the {110} lattice plane and are not well-suited for seeding epitaxial growth. Furthermore, where there is no recess, the dopant in the epitaxy layer is further away from the fin channel when compared with the recessed case. After a thermal anneal is performed to form the overlap junction between source/drain and gate, the junction has a higher gradient than when not recessed, which degrades device performance.

SUMMARY

According to an embodiment of the present principles, a field effect transistor (FinFET) device having a dielectric layer (e.g., oxide layer) on a semiconductor substrate layer is described herein. Crystalline fin portions that are separate from the semiconductor substrate layer are located within a top part of the dielectric layer. The fin portions have a surface oriented in a crystalline plane and are located in source/drain regions of the device. The fin portions are dielectrically isolated from each other by the dielectric layer. An epitaxial layer of semiconductor material is formed on the crystalline fin portions in the source/drain regions, with the surface of the fins providing a seed surface for forming the epitaxial layer. A gate structure is present between the source/drain regions.

According to another embodiment of the present principles, a field effect transistor (FinFET) device is described herein. The device includes crystalline fin portions separate from a semiconductor substrate layer. The crystalline fin portions have surfaces orientated in a crystalline plane and are located in source/drain regions of the device. The device further includes an epitaxial layer of semiconductor material formed on the crystalline fin portions in the source/drain regions.

According to yet another embodiment of the present principles, field effect transistor (FinFET) device is described herein. The device includes crystalline fin portions separate from a semiconductor substrate layer and located within a dielectric layer. The crystalline fin portions have surfaces orientated in a crystalline plane, are located in source/drain regions of the device, and are dielectrically isolated from each other by the dielectric layer. The device further includes an epitaxial layer of semiconductor material formed on the crystalline fin portions in the source/drain regions.

According to yet another embodiment of the present principles, a field effect transistor (FinFET) device is described herein. The device includes crystalline fin portions separate from a semiconductor substrate layer. The crystalline fin portions have surfaces orientated in a crystalline plane and are located in source/drain regions of the device. The device further includes an epitaxial layer of semiconductor material formed on the crystalline fin portions in the source/drain regions. The surfaces of the crystalline fin portions provide seed surfaces for forming the epitaxial layer.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein:

FIG. 12 is a top plan view of a finished FinFET device, in which the sacrificial gate structure has been replaced, in accordance with an embodiment of the present principles;

FIG. 13 is a cross-sectional view of a finished FinFET device taken along line A-A of FIG. 12, through the channel region, in accordance with an embodiment of the present principles;

FIG. 14 is a cross-sectional view of a finished FinFET device taken along line B-B of FIG. 12, parallel to the source/drain region, in accordance with an embodiment of the present principles;

FIG. 15 is a cross-sectional view of a finished FinFET device taken along line C-C of FIG. 12, perpendicular to the gate region, in accordance with an embodiment of the present principles.

DETAILED DESCRIPTION

Figure 3:
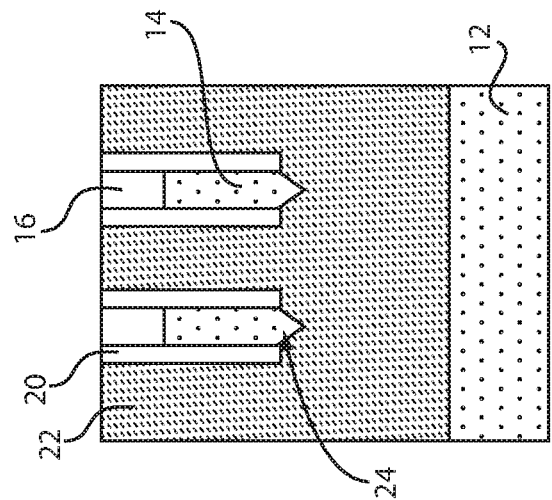
FIG. 3 is a cross-sectional view of a FinFET device at a stage of device fabrication in which a shallow trench isolation material is deposited, and a thermal oxidation is performed to oxidize the lower portion of the fins in accordance with an embodiment of the present principles.

According to present principles, a FinFET device is formed in which fins are formed on a semiconductor substrate. The fins are dielectrically isolated from each other by a dielectric layer. Portions of the fins are thermally oxidized, converting those portions to the dielectric (e.g., oxide) material. The remaining fin portions have fin tails at their ends. In one embodiment, the fin tails may have a triangular shape at an end.

Before forming an epitaxial layer in the source/drain region, portions of the fins that remain after thermal oxidation are removed in an annealing process taking place in an annealing atmosphere, leaving the fin tails to remain within the dielectric, e.g., oxide layer. Upper fin tail surfaces are at the top of the dielectric layer. The fin tails are dielectrically isolated from each other by the dielectric layer. The crystalline top surface of the fin tail lies in the $\{100\}$ lattice plane. During formation of the source/drain epitaxial layers by growing crystalline semiconductor material, high quality epitaxy is obtained by using the surface of the fin tails, which are oriented with the $\{100\}$ lattice plane, as the seed surface for epitaxial growth. For example, the crystalline semiconductor material grown on the seed surfaces is substantially defect-free.

In one embodiment, the fin tails are embedded in the dielectric layer, with the upper fin tail surfaces being available for seeding epitaxial growth of substantially defect-free crystalline semiconductor material.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with an embodiment of the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 1:
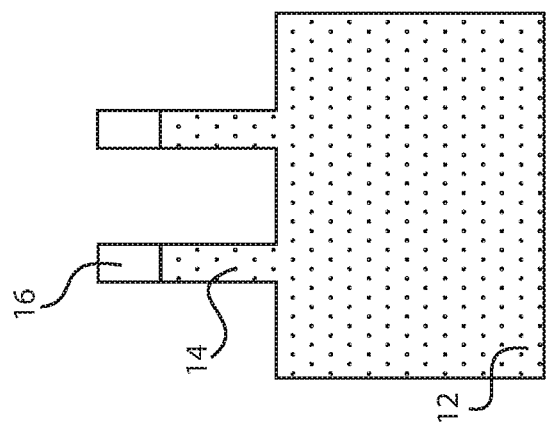
FIG. 1 is a cross-sectional view of a FinFET device at an early stage of device fabrication in which fins are formed on a substrate in accordance with an embodiment of the present principles.

Referring now to the drawings in which like numerals represent the same or similar elements and initially to FIG. 1, depicted from the perspective of a semiconductor structure at an early step in forming a FinFET device according to an embodiment of present principles. Fins 14 are formed on a semiconductor substrate 12. The semiconductor substrate 12 may be made from a semiconductor material such as, silicon, germanium and silicon-germanium alloy, among other materials and alloys. In the described embodiment according to present principles, the semiconductor substrate material is silicon.

Fins 14 are formed on the silicon substrate 12. In one other embodiment, the fins 14 may be formed from the silicon substrate 12 by etching down through the substrate layer 12 in a fin-forming pattern. In another embodiment, the material for the fins 14 may be grown or otherwise deposited on the substrate 12 and subsequently etched. In other embodiments, the fins may be selectively grown on the substrate, e.g., epitaxially grown in a fin-forming pattern. Other processes for forming the fins may also be employed. In one embodiment, "fin-forming pattern" refers to a fin-forming arrangement in which the length dimension, extending through the source/drain regions, is the biggest of the three dimensions, e.g., length is bigger than width and height. The fins are provided with a nitride cap 16 on an upper part of the fins, e.g., a silicon nitride (SiN) cap. The caps may be formed by performing a rapid thermal chemical vapor deposition (RTCVD) of SiN or by performing an equivalent process. In one embodiment, this step is followed by a spacer etch back to complete the caps.

Figure 2:
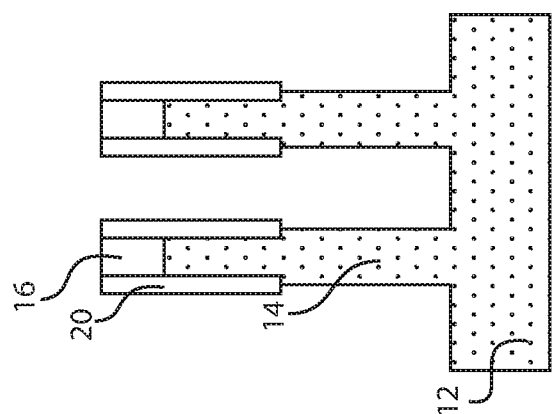
FIG. 2 is a cross-sectional view of a FinFET device at a stage of device fabrication in which sidewall spacers are formed on the fins and fin length is extended in accordance with an embodiment of the present principles.

Referring to FIG. 2, spacers 20 are formed by depositing an insulating layer on the fins 14. In one embodiment, the spacers are formed from the deposition of a dielectric material, such as silicon nitride (SiN), followed by a directional etch process such as reactive ion etch (RIE). The fins are then lengthened by performing a selective etch, e.g., such as by performing reactive ion etching (RIE), or chemical dry etch. As a result of the substrate etch, the top of surface of substrate 12 is lower than that of the substrate 12 in FIG. 1, exposing lower portions of the fins 14 that are not covered by the spacers 20.

Referring to FIG. 3, a shallow trench isolation material 22, e.g., a dielectric material, is deposited on top of the fins 14 to fill the trenches between fins. Here, the dielectric material 22, which for example may be an oxide material, is added as a layer at least up to the top of the fins 14, caps 16 and spacers 20. These steps may be performed in accordance with shallow trench isolation (STI), wherein the trenches are patterned on the substrate to isolate individual devices, the channels are etched, filled with a dielectric material, e.g., an oxide material such as silicon dioxide, and then the oxide material is polished by procedure such as chemical mechanical polishing (CMP). The deposit of oxide material provides an oxide layer 22 on the substrate that surrounds the fins.

Oxidation is performed on the structure. The oxidation process may be a thermal oxidation process. In some embodiments, the oxidation occurs in a furnace set to a temperature in the range of about 900° C. to about 1300° C. Oxygen in the furnace diffuses through the shallow trench isolation region to react with the silicon of substrate 12, forming an oxide region, including the oxide region formed at the base of the fin 14, leaving non-oxidized portion of fin 14. Oxide region has a "V-shaped" or "tail" profile, in which the oxide region is higher near the exterior of the fin, and lower near the interior of the fin. In the thermal oxidation procedure, lower portions of the fins 14 below the spacers 20 are converted to silicon dioxide ($SiO_2$). Fin tails 24, extending downward from within the spacers 20, are formed at the bottoms of the fins 14.

Figure 4:
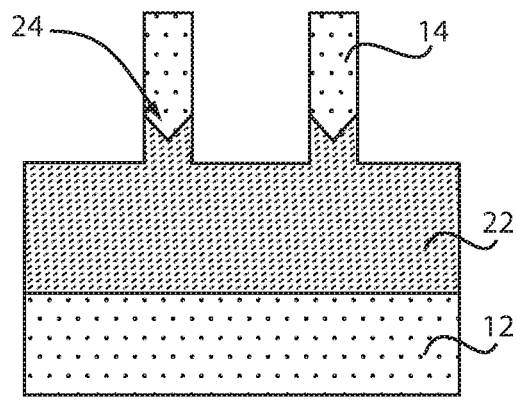
FIG. 4 is a cross-sectional view through a source/drain region of a FinFET device at a stage of device fabrication in which a part of the oxide layer that encapsulates the fins has been removed in accordance with an embodiment of the present principles.

Referring to FIG. 4, the shallow trench isolation region (e.g., oxide layer) 22 is selectively recessed to remove a part thereof that surrounds the fins 14. A portion of the shallow trench isolation region may remain after the recess. The recessing leaves the fin tails 24 within the oxide layer, with the fins protruding upward from the remaining oxide layer. The SiN cap 16 on the top of the fins and the spacers 20 surrounding the fins 14 are removed.

Figure 5:
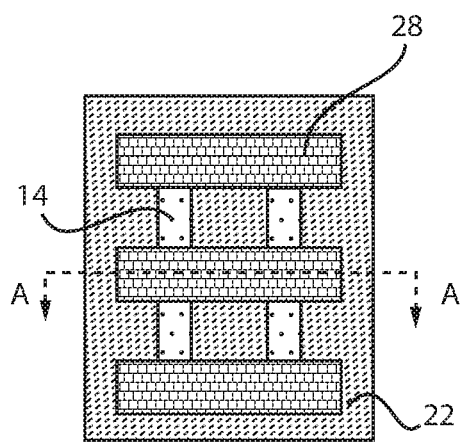
FIG. 5 is a top plan view of a FinFET device at a stage of device fabrication in which a sacrificial gate structure and nitride gate cap are formed accordance with an embodiment of the present principles.
Figure 6:
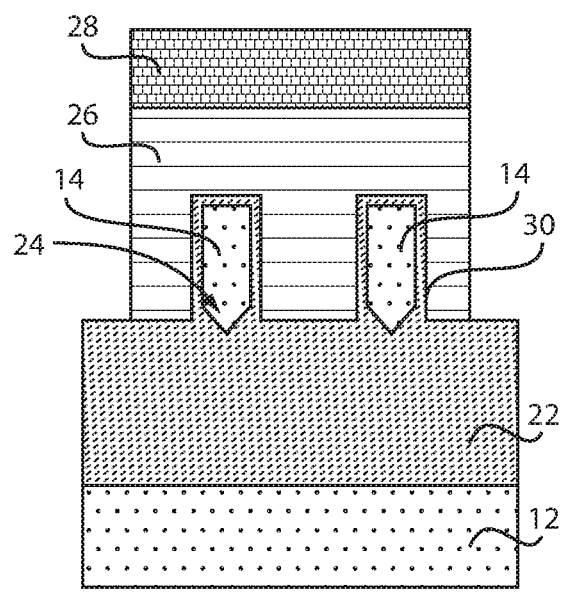
FIG. 6 is a cross-sectional view along line A-A of FIG. 5 illustrating, in cross-section, the stage of device fabrication of FIG. 5 in accordance with an embodiment of the present principles.

Referring to FIGS. 5 and 6, a sacrificial gate structure 26, to later be replaced by a metal gate structure, is formed over the fins 14. In one embodiment, a sacrificial gate oxide 30 is initially deposited around the fins 14. The sacrificial gate structure 26 is then formed by depositing a material around the sidewalls and the tops of the fins 14 (that have been encased in sacrificial gate oxide 30). In one embodiment, the material of the sacrificial gate is polycrystalline silicon, and the sacrificial gate formed by a process such a low pressure chemical vapor deposition (LPCVD). A dielectric cap 28, e.g., a nitride cap, is formed over the sacrificial gate structure 26. While the sacrificial gate structure may be formed from polycrystalline silicon, it should be understood that any appropriate material may be used and may be formed by any appropriate process.

By forming a sacrificial gate structure and later replacing it with a metal gate structure, metal gate structures made of stack materials that cannot withstand high temperature processing can be employed, since the metal gate structure is formed after completing front-end processing steps. The sacrificial gate structure defines the geometry of the later-formed gate structure that functions to switch the device from an "on" to "off" state, and vice versa. A process sequence employing a sacrificial gate structure may be referred to as a "gate last" process sequence. Both gate first and gate last process sequences are applicable to the present disclosure.

Figure 7:
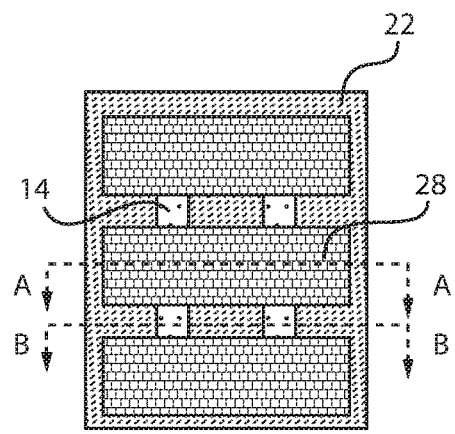
FIG. 7 is a top plan view of a FinFET device at a stage of device fabrication in which spacers are created on the sides of the sacrificial gate structure in accordance with an embodiment of the present principles.
Figure 8:
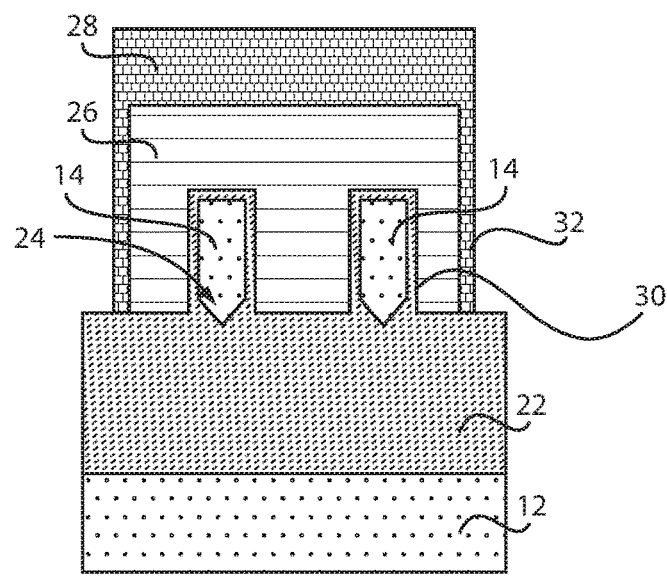
FIG. 8 is a cross-sectional view along line A-A of FIG. 7 illustrating, in cross-section, the stage of device fabrication of FIG. 7, parallel to the gate structure, in accordance with an embodiment of the present principles.
Figure 9:
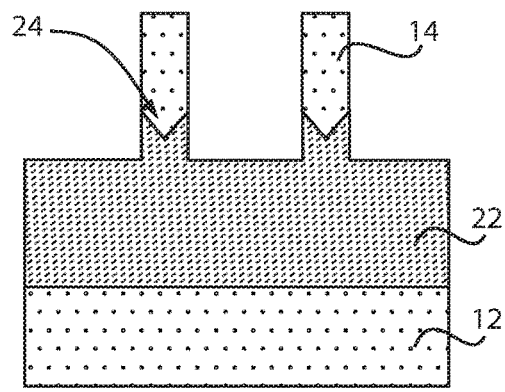
FIG. 9 is a cross-sectional view along line B-B of FIG. 7 illustrating, in cross-section, the stage of device fabrication of FIG. 7, parallel to the source/drain region, in accordance with an embodiment of the present principles.

Referring to FIGS. 7, 8 and 9, spacers 32 are formed on the sides of the sacrificial gate 26. The spacer material may be a nitride such as silicon nitride. The spacers may be formed by performing a rapid thermal chemical vapor deposition (RTCVD) of SiN or an equivalent process. In one embodiment, this step is followed by a spacer etch back to complete the spacers. FIG. 8 is taken along line A-A of FIG. 7, which extends through the gate and illustrates in cross section the gate structure and the fins at this stage of the process. FIG. 9 is taken along line B-B of FIG. 7 and illustrates in cross section the fin tails 24 buried in the oxide layer 22 the substrate 12. Line B-B is positioned in the source/drain region.

Figure 10:
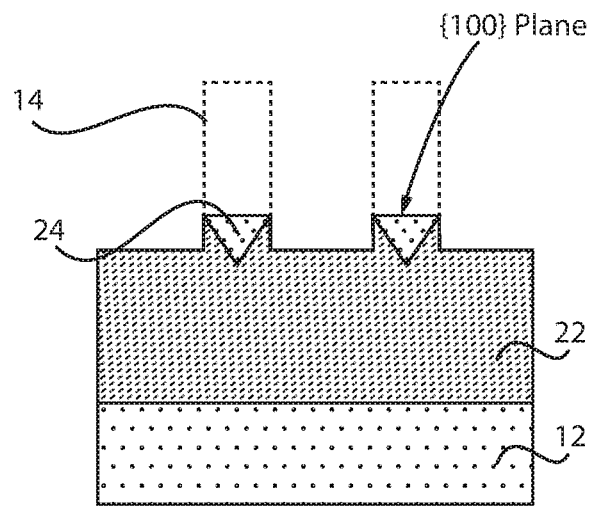
FIG. 10 is a simplified cross-sectional view through a source/drain region of a FinFET device at a stage of device fabrication in which the upper part of the fins have been removed, leaving fin tails within the oxide layer, in accordance with an embodiment of the present principles.

Referring to FIG. 10, an annealing process is employed to remove a substantial portion of fins while leaving the fin tails 24 in place. In one embodiment, the annealing process takes place in a hydrogen atmosphere. For example, the annealing may take place in an atmosphere including hydrogen gas, e.g., hydrogen gas ($H_2$) with a mass number of about 1, with deuterium gas ($^2H_2$) including deuterium ($^2H$) with a mass number of about 2, or combinations of hydrogen gas and deuterium gas. Deuterium (D or $^2H$) is an isotope of hydrogen (H) and is often referred to as heavy hydrogen. The hydrogen anneal may be performed in a hydrogen environment at about 500° C. to 1200° C., preferably between about 600° C. and 1100° C., more preferably between about 800° C. and about 950° C. The anneal pressure may be anywhere from about 1 mTorr to about 2000 Torr, preferably from about 1 Torr to about 1000 Torr, and more preferably from about 20 Torr to about 300 Torr. The ambient atmosphere during the hydrogen anneal in some embodiments is essentially only the hydrogen isotope(s). In another embodiment the atmosphere may include inert carrier gases, for example, nitrogen, argon, xenon, helium and mixtures thereof. The annealing time varies depending on the pressure and temperature of the process and may be in the range of about 20 seconds to 30 minutes. During hydrogen annealing, the exposed semiconductor fins in the source/drain region react with hydrogen such as $Si+H_2=SiH_2$ (silylene), or $Si+H_2=SiH_4$ (silane). In one embodiment, substantially all of the fin portions are removed, except for the fin tails which are within the dielectric layer 22, with the top surfaces of the fin tails 24 being oriented in the {100} lattice plane and being available as a seed surface for epitaxial growth of crystalline semiconductor material, e.g., an epitaxial layer or film deposited on a {100} plane crystal surface will take on a {100} orientation. The top surfaces of the fin tails oriented in this way provide an effective surface for seeding a good source/drain epitaxy.

Figure 11:
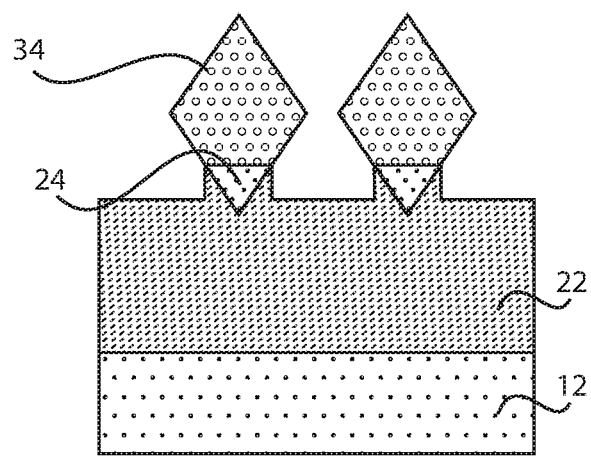
FIG. 11 is a simplified cross-sectional view through a source/drain region of a FinFET device at a stage of device fabrication in which epitaxial layers of semiconductor material have been grown on the fin tails, in accordance with an embodiment of the present principles.

Referring to FIG. 11, an epitaxial layer 34 of semiconductor material is grown in the source/drain regions on the crystalline surface of the fin tails 24 that are oriented in the {100} lattice plane. The epitaxial growth occurs on both sides of the sacrificial gate structure 26. The term "epitaxial" denotes that a material is formed using an epitaxial growth process. The epitaxial growth material of layer 34 may be silicon, germanium, a silicon-germanium (SiGe) alloy and/or carbon doped silicon (Si:C). In the described embodiment, the epitaxial material is SiGe. Good epitaxial growth of a SiGe semiconductor layer has occurred over surfaces of the fin tails in the source drain regions perpendicular and parallel to the fins. The presence of defects in crystal structure (such as dislocations, twins, and stacking faults) are not detected. Such crystalline defects, if present, could interfere with the semiconductor properties and performance of the final device.

The SiGe layer can be formed, for example, by a selective epitaxial process using a combination of silicon-containing gas, a germanium-containing gas, a carrier gas, and optionally, an etchant gas. The silicon containing gas may be a gas such as silane ($SiH_4$), dichlorosilane ($SiH_2Cl_2$), disilane ($Si_2H_6$), trisilane ($Si_3H_8$) or tetrasilane ($Si_4H_{10}$). The germanium containing gas may be a gas such as germane ($GeH_4$) or digermane ($Ge_2H_6$). The carrier gas may be a gas such as nitrogen, hydrogen, or argon. The optional etchant gas may be a gas such as hydrogen chloride (HCl) or chlorine ($Cl_2$). The formation may occur at a temperature ranging from about 450° C. to about 900° C. The SiGe layer may have a Ge concentration of about 15% to about 100%, preferably from about 20% to about 60%.

In one embodiment, the epitaxial material may include carbon doped silicon with an atomic carbon concentration of between about 0.2% to about 4.0% (atomic concentration) carbon. In another embodiment the epitaxial material may be silicon. In yet another embodiment the epitaxial material is SiGe with germanium concentration ranges from 15% to 95%. In one embodiment, the epitaxial material is germanium. The epitaxial material can be in-situ doped (e.g., dopants are incorporated in the epitaxy material during the epitaxial growth process) and/or ex-situ doped (e.g., dopants are incorporated in the epitaxy material after epitaxial growth). The doping concentration may range from $1\times10^{18}$ atoms/cm$^3$ to $2\times10^{21}$ atoms/cm$^3$ and more preferably from $5\times10^{19}$ atoms/cm$^3$ to $1\times10^{21}$ atoms/cm$^3$. N-type dopants include phosphorus, arsenic, and antimony. P-type dopants include boron, indium, and gallium. Typically, SiGe epitaxy is used as the source/drain for p-type devices and silicon or silicon:carbon (Si:C) epitaxy is used as the source/drain for n-type devices. Ex-situ doping techniques include but are not limited to: ion implantation, plasma doping, gas phase doping, solid phase doping, liquid phase doping. Thermal annealing process may be performed for dopant diffusion/activation. The annealing processes include but are not limited to, laser anneal, flash annealing, rapid thermal annealing. The removal of the exposed fin in the source/drain region by hydrogen annealing and the epitaxy growth can be done in the same process chamber.

FIGS. 12, 13, 14 and 15 show the completed FinFET device according to present principles, in which the sacrificial gate structure 26 is replaced with metal gate structure 38. FIG. 12 is a top plan view of the completed FinFET device 50. FIG. 13 shows the device 50 along line A-A of FIG. 12, e.g., a cross-sectional view through the (not numbered) channel region passing under the metal gate structure 38. The fins 14 may remain as is, e.g., intact, in the channel area under the gates, as they were protected during the hydrogen annealing by the sacrificial gate structure 26.

The sacrificial gate 26 may be removed by polishing, e.g., CMP, in one or more polishing steps, employing one or more appropriate slurry compositions, followed by a wet etch process. Gate structure 38 formed in the channel portion of the device extends over the source/drain epitaxial layers 34 present in the channel. The gate structure 38 controls output current, i.e., flow of carriers in the channel portion of the FinFET through electrical or magnetic fields. The channel portion is the region between the source region and the drain region of a device, e.g., FinFET, that becomes conductive when the device is powered. The gate structure 38 includes at least one gate dielectric 40 that is formed on the channel portion of each fin 14 under the gate structure, and at least one gate conductor 42 that is formed on the at least one gate dielectric 40. The gate structure 38 may be formed by forming blanket material layers for the at least one gate dielectric 40 and the at least one gate conductor 42 to provide a gate stack, and patterning and etching the gate stack to provide the gate structure 38. The gate structures 38 can be formed utilizing photolithography and etch process steps.

The at least one gate conductor 42 may comprise materials including, but not limited to metals, metal alloys, metal nitrides and metal silicides, as well as laminates thereof and composites thereof. In some embodiments, gate conductor 42 may be comprised of a metal such as titanium nitride (TiN) or ruthenium (Ru) for a pFET, or titanium aluminum (TiAl), aluminum nitride (AlN) or tantalum carbide (TaC) for a nFET. The gate structure 38 may be formed by blanket depositing the material layers for the at least one gate dielectric 40, and the at least one gate conductor 42 to provide a gate stack, followed by a chemical planar polishing (CMP) step to form the gate structure 38.

The high dielectric constant (high-k) material 40 is deposited around the metal gate as a gate insulating material. In one embodiment, the high-k dielectric layer 40 is composed of a high-k oxide, such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for dielectric layer 40 include hafnium silicate, hafnium silicon oxynitride or combinations thereof.

In one embodiment, the at least one first gate dielectric may be deposited by chemical vapor deposition (CVD). Variations of CVD processes suitable for depositing the at least one first gate dielectric layer include, but are not limited to atmospheric pressure chemical vapor deposition (APCVD), low pressure chemical vapor deposition (LPCVD), plasma enhanced chemical vapor deposition (PECVD), metal organic chemical vapor deposition (MOCVD), atomic layer deposition (ALD), and combinations thereof. In one embodiment, the thickness of the at least one first gate dielectric layer 40 is greater than 0.8 nm. More typically, the at least one first gate dielectric layer 40 has a thickness ranging from about 1.0 nm to about 6.0 nm.

The high-k dielectric materials reduce leakage current significantly (e.g., by 100×). High-k gate dielectrics can have a greater thickness than, for example, $SiO_2$. Use of metal gates with appropriate work functions can provide the proper threshold voltages ($V_t$) and significantly reduce channel mobility degradation. With the combination of high-k gate dielectrics and metal gates, the transistor performance can be significantly improved, and scaling below ~50 nm becomes possible.

The advantage of this approach to forming the gate structure, e.g., first forming a sacrificial gate structure that will be replaced by a metal gate structure is that metal gate structures with stack materials that cannot withstand high temperature processing are better off being fabricated after the front-end processing steps are completed. As contemplated, sacrificial polycrystalline silicon gates are fabricated first and then replaced with metal gates, e.g., a replacement metal gate.

As shown in FIGS. 12, 13, 14 and 15, a low-k inter-layer dielectric (ILD) material 44 is deposited to separate closely-spaced interconnect lines arranged in the levels of the device. As shown in FIG. 15, taken along line C-C of FIG. 12, and perpendicular to the gate material, the ILD material 44 extends above the source-drain epitaxial material.

The material for the ILD may be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the ILD material include any of the aforementioned materials in porous form, or in a form that changes during processing to or from being porous and/or permeable to being non-porous and/or non-permeable.

Figure 16:
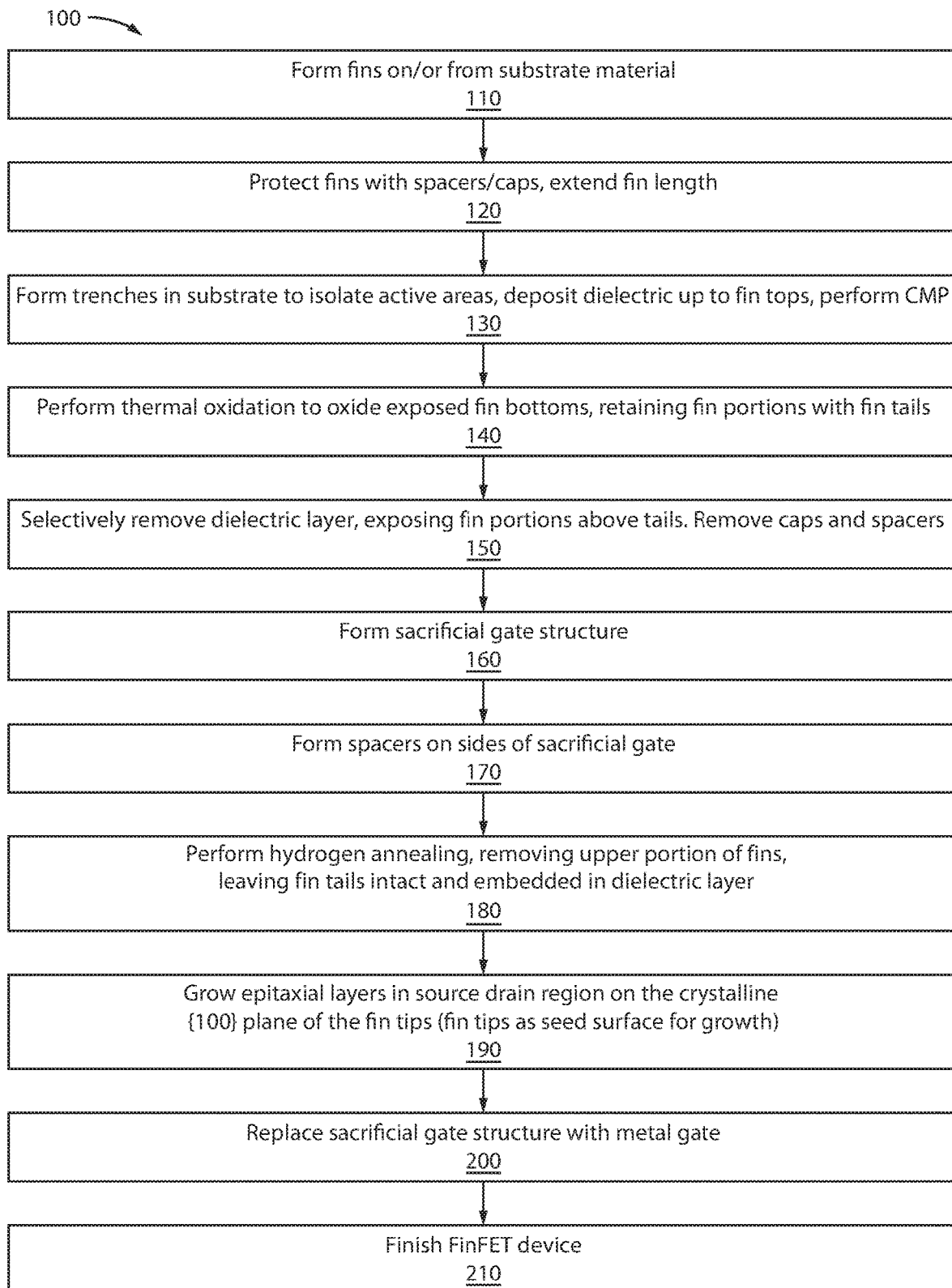
FIG. 16 is a block flow diagram illustrating an exemplary method of FinFET device fabrication, in accordance with an embodiment of the present principles.

FIG. 16 is a block flow diagram demonstrating a method 100 for forming a FinFET device with good epitaxial growth in the source/drain regions in accordance with an embodiment of the present principles. In some alternative embodiments, the items noted in the blocks may occur out of the order given in the flow diagram. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 110, fins are formed on a substrate material, e.g., a silicon substrate material. Fin formation may be effected by forming the fins out of the substrate material, such as by etching in a fin-forming pattern, or by another approach such as epitaxially growing the fins on the substrate.

In block 120, spacers are formed on sidewalls of the fins and caps are formed on the top of the fins. Fin length is extended, e.g., by performing an etch-down on the substrate.

In block 130, trenches are formed on the surface of the Si substrate to isolate active areas. A dielectric layer, e.g., an oxide layer, is deposited to at least the tops of the fins, and chemical mechanical polishing (CMP) is performed. These steps may be performed in accordance with the STI technique.

In block 140, thermal oxidation is performed to oxidize the exposed fin bottoms. Upper portions of the fins that encased within the spacers and caps are preserved. The oxidation process forms fin tails on the bottoms of the fins.

In block 150, the dielectric layer, e.g., the oxide layer, is selectively removed to expose the fin portions above the fin tails. The caps and spacers are removed from the fins.

In block 160, a sacrificial gate structure is formed, e.g., a polycrystalline silicon sacrificial gate structure is formed.

In block 170, spacers are formed on the side of the sacrificial gate structure.

In block 180, hydrogen annealing is performed, which removes the upper portions of the fins, leaving the fin tails intact and located within the dielectric layer. Individual fin tails are dielectrically isolated from each other in the dielectric layer.

In block 190, epitaxial layers are grown in the source/drain region on the crystalline fin tip surfaces oriented in the {100} lattice plane. The growth may be crystalline SeGe semiconductor material or another suitable semiconductor material.

In block 200, the sacrificial gate structure is removed and replaced with a metal gate structure. The sacrificial gate may be removed by polishing, e.g., CMP, in one or more polishing steps, employing one or more appropriate slurry compositions. The metal gate that replaces the sacrificial gate may be constructed of metals, metal alloys, metal nitrides and metal silicides, as well as laminates thereof and composites thereof. Further, a high-k dielectric material is deposited around the metal gate. Exemplary materials suited for use as the high-k dielectric material are zirconium oxide and hafnium oxide. The metal gate is connected to the device with a gate electrode contact.

In block 210, any further steps, if necessary are performed to complete the FinFET device. For example, an inter-layer dielectric (ILD) may be deposited to separate closely-spaced interconnect lines arranged in the levels of the device. The ILD material has a low dielectric constant k. e.g., as close to 1 as possible, in order to minimize capacitive coupling ("cross talk") between adjacent metal lines. Furthermore, any other electrical contacts are established, to the extent they have not been established previously.

The structure of the FinFET devices with improved source/drain epitaxy and methods for forming same in accordance with embodiments of the present principles offer several advantages and improvements. For example:

The isolation of the fins and epitaxial layers grown on the fin tails provides excellent isolation of device circuitry, similar to a SOI FinFET device. Also, the surface of the crystalline fin tails, oriented in the {100} lattice plane, provides an excellent seed surface for epitaxial growth, similar to bulk FinFET. The epitaxial layers are shown to be highly crystalline and free of defects that could adversely affect device performance.

According to present principles, the FinFET device and method for forming same provide isolation of circuitry associated with SOI FinFET devices while also possessing features that promote good epitaxial growth found in bulk FinFET devices.

Throughout this disclosure oxide, nitride and polycrystalline silicon materials are described. However, these materials are illustrative and other materials are also contemplated and within the scope of the invention. In addition, dimensions of thicknesses are described throughout this disclosure. These thickness dimensions are illustrative and other dimensions may be employed in accordance with embodiments of the present principles.

Having described preferred embodiments for a method and structure for forming dielectric isolated FinFET with improved source/drain epitaxy (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a field effect transistor, the method comprising:
   providing a plurality of fins on a substrate, each fin comprising an upper fin portion and a lower fin portion, the upper fin portion having sidewall spacers thereon;
   depositing a dielectric layer on and around the plurality of fins, the dielectric layer contacting the lower fin portions and the sidewall spacers on the upper fin portions of each of the plurality of fins; and
   oxidizing the lower fin portions of the plurality of fins through the dielectric layer to form a plurality of remaining fin portions such that the plurality of remaining fin portions are isolated from the substrate by an oxide.

2. The method of claim 1, wherein the dielectric layer fills space between the plurality of fins.

3. The method of claim 1, wherein oxidizing the lower fin portions is performed between a temperature of about 900 to 1300° C.

4. The method of claim 1, wherein each of the plurality of remaining fin portions comprise a v-shaped bottom surface.

5. The method of claim 1, wherein each of the plurality of remaining fin portions extends horizontally in a first direction, the method further comprising:
   forming a plurality of sacrificial gate structures extending horizontally in a second direction substantially orthogonal to the first direction, each of the plurality of sacrificial gate structures covering portions of each of the plurality of remaining fin portions; and
   annealing the plurality of remaining fin portions in a gaseous ambient such that uncovered portions of each of the plurality of remaining fin portions are at least partially removed.

6. The method of claim 5, wherein a bottom region of each of the plurality of remaining fin portions comprises a v-shaped bottom surface, and wherein a height of the remaining fin portions in the uncovered portions of each of the plurality of remaining fin portions in a direction perpendicular to a plane defined by the substrate is substantially less than a height of the remaining fin portions in covered portions of each of the plurality of remaining fin portions.

7. The method of claim 5, wherein:
   the annealing leaves an exposed {100} silicon surface in the uncovered portions; and
   the method further comprises epitaxially growing source/drain material on the exposed {100} surface.

8. The method of claim 7, wherein the source/drain material comprises silicon-germanium.

9. The method of claim 7, wherein the source/drain material comprises carbon-doped silicon.

10. The method of claim 5, wherein the gaseous ambient comprises hydrogen.

11. The method of claim 5, wherein the gaseous ambient comprises deuterium.

12. A method of forming a field effect transistor, the method comprising:
    forming a hardmask pattern over a substrate;
    etching a first distance into the substrate to form a plurality of upper fin portions;
    forming sidewall spacers on each of the plurality of upper fin portions;
    subsequent to forming the sidewall spacers, etching a second distance into the substrate to form a plurality of lower fin portions thereby forming a plurality of fins corresponding to the hardmask pattern, each of the plurality of fins comprising an upper fin portion and a lower fin portion;
    depositing a dielectric layer on and around the plurality of fins, the dielectric layer contacting the lower fin portions and the sidewall spacers on the upper fin portions of each of the plurality of fins; and
    oxidizing the lower fin portions of the plurality of fins through the dielectric layer to form a plurality of remaining fin portions such that each of the plurality of remaining fin portions is isolated from the substrate by an oxide.

13. The method of claim 12, wherein the dielectric layer fills space between the plurality of fins.

14. The method of claim 12, wherein oxidizing the lower fin portions is performed between a temperature of about 900 to 1300° C.

15. The method of claim 12, wherein each of the plurality of remaining fin portions comprise a v-shaped bottom surface.

16. The method of claim 12, wherein each of the plurality of remaining fin portions extends horizontally in a first direction, the method further comprising:
   forming a plurality of sacrificial gate structures extending horizontally in a second direction substantially orthogonal to the first direction, each of the plurality of sacrificial gate structures covering portions of each of the plurality of remaining fin portions; and
   annealing the plurality of remaining fin portions in a gaseous ambient such that uncovered portions of each of the plurality of remaining fin portions are at least partially removed.

17. A method of forming a field effect transistor, the method comprising:
   one of (i) growing semiconductor material on a substrate or (ii) depositing semiconductor material on the substrate;
   forming a hardmask pattern over the semiconductor material;
   etching a first distance into the semiconductor material to form a plurality of upper fin portions;
   forming sidewall spacers on each of the plurality of upper fin portions;
   subsequent to forming the sidewall spacers, etching a second distance into the semiconductor material to form a plurality of lower fin portions thereby forming a plurality of fins corresponding to the hardmask pattern, each of the plurality of fins comprising an upper fin portion and a lower fin portion;
   depositing a dielectric layer on and around the plurality of fins, the dielectric layer contacting the lower fin portions and the sidewall spacers on the upper fin portions of each of the plurality of fins; and
   oxidizing the lower fin portions of the plurality of fins through the dielectric layer to form a plurality of remaining fin portions such that each of the plurality of remaining fin portions is isolated from the substrate by an oxide.

18. The method of claim 17, wherein the dielectric layer fills space between the plurality of fins.

19. The method of claim 17, wherein oxidizing the lower fin portions is performed between a temperature of about 900 to 1300° C.

20. The method of claim 17, wherein each of the plurality of remaining fin portions comprise a v-shaped bottom surface.

21. The method of claim 17, wherein the plurality of remaining fin portions extends horizontally in a first direction, the method further comprising:
   forming a plurality of sacrificial gate structures extending horizontally in a second direction substantially orthogonal to the first direction, each of the plurality of sacrificial gate structures covering portions of each of the plurality of remaining fin portions; and
   annealing the plurality of remaining fin portions in a gaseous ambient such that uncovered portions of each of the plurality of remaining fin portions are at least partially removed.

* * * * *